(12) United States Patent
Lee et al.

(10) Patent No.: US 9,129,888 B2
(45) Date of Patent: Sep. 8, 2015

(54) NITRIDE-BASED SEMICONDUCTOR DEVICE AND MANUFACTURING METHOD THEREOF

(71) Applicant: SAMSUNG ELECTRONICS CO., LTD., Yongin, Gyeonggi-Do (KR)

(72) Inventors: Jae Hoon Lee, Suwon-si (KR); Young Sun Kwak, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 25 days.

(21) Appl. No.: 13/947,517

(22) Filed: Jul. 22, 2013

(65) Prior Publication Data
US 2014/0021481 A1   Jan. 23, 2014

(30) Foreign Application Priority Data
Jul. 23, 2012 (KR) .................. 10-2012-0079798

(51) Int. Cl.
| | |
|---|---|
| H01L 29/20 | (2006.01) |
| H01L 21/02 | (2006.01) |
| H01L 29/66 | (2006.01) |
| H01L 29/778 | (2006.01) |
| H01L 29/207 | (2006.01) |
| H01L 29/36 | (2006.01) |
| H01L 29/423 | (2006.01) |
| H01L 23/29 | (2006.01) |

(52) U.S. Cl.
CPC ........ H01L 29/2003 (2013.01); H01L 21/0237 (2013.01); H01L 21/0254 (2013.01); H01L 21/02447 (2013.01); H01L 21/02458 (2013.01); H01L 21/02521 (2013.01); H01L 29/207 (2013.01); H01L 29/66462 (2013.01); H01L 29/7781 (2013.01); H01L 29/7783 (2013.01); H01L 23/291 (2013.01); H01L 29/365 (2013.01); H01L 29/4236 (2013.01); H01L 2924/0002 (2013.01)

(58) Field of Classification Search
CPC ................. H01L 29/2003; H01L 21/0254
USPC .............. 257/76, 194, 12, 101, 39, 155, 190; 438/478, 167, 172
See application file for complete search history.

(56) References Cited

U.S. PATENT DOCUMENTS

| | | | | |
|---|---|---|---|---|
| 6,674,131 | B2 * | 1/2004 | Yokogawa et al. | 257/379 |
| 6,867,078 | B1 * | 3/2005 | Green et al. | 438/167 |
| 7,276,723 | B2 * | 10/2007 | Fathimulla et al. | 257/20 |
| 7,382,001 | B2 * | 6/2008 | Beach | 257/194 |
| 2009/0085054 | A1 * | 4/2009 | Jeon et al. | 257/101 |

FOREIGN PATENT DOCUMENTS

| | | |
|---|---|---|
| JP | 1998-270464 A | 10/1998 |
| KR | 10-2000-0004749 A | 2/2000 |
| KR | 10-210-0043889 A | 4/2010 |
| KR | 10-2011-0067512 A | 6/2011 |

* cited by examiner

*Primary Examiner* — Sheng Zhu
(74) *Attorney, Agent, or Firm* — Lee & Morse, P.C.

(57) ABSTRACT

A nitride-based semiconductor device includes a buffer layer on a substrate, a nitride-based semiconductor layer on the buffer layer, at least one ion implanted layer within the nitride-based semiconductor layer, and a channel layer on the nitride-based semiconductor layer.

19 Claims, 5 Drawing Sheets

NITRIDE-BASED SEMICONDUCTOR DEVICE AND MANUFACTURING METHOD THEREOF

CROSS-REFERENCE TO RELATED APPLICATION

Korean Patent Application No. 10-2012-0079798 filed on Jul. 23, 2012, in the Korean Intellectual Property Office, and entitled: "NITRIDE-BASED SEMICONDUCTOR DEVICE AND MANUFACTURING METHOD THEREOF," is incorporated by reference herein in its entirety.

BACKGROUND

1. Field

Example embodiments relate to a nitride-based semiconductor device and a manufacturing method thereof, and more particularly, to a nitride-based semiconductor device for preventing a leakage current and a manufacturing method thereof.

2. Description of the Related Art

Information communication technologies have been developed for ultra-high speed and high-capacity signal transmission. With the ever increasing number of applications for personal mobile devices, satellite communications, military radars, broadcast communications, and communication relays in the wireless communication field, the demand for a high-speed, high-power electronic device for an ultra-high speed information communication system operating in microwave bands and millimeter wave bands has been increasing. Transitively, attempts have been made to reduce an energy loss in a high-speed high-power electronic device.

For example, studies have been conducted on developing a high-speed, high-power electronic device using a gallium nitride (GaN)-based semiconductor with excellent properties, e.g., a high energy gap, a high thermal and chemical stability, and a high electronic saturation velocity of about $3 \times 10^7$ centimeters per second (cm/sec). A GaN-based semiconductor device is known to have a high breakdown field of about $3 \times 10^6$ volts per centimeter (V/cm), a large maximum current density, stability at a high temperature, and a high thermal conductivity. Also, a heterojunction field effect transistor (HFET) using an aluminum gallium nitride (AlGaN)/GaN heterojunction structure has large band discontinuities at an interface, resulting in high electron mobility in which a great number of electrons are freed.

SUMMARY

An aspect of example embodiments provides a nitride-based semiconductor device with at least one ion implanted layer within a nitride-based semiconductor layer, thereby preventing a leakage current, and a manufacturing method thereof.

According to an aspect of the example embodiments, there is provided a nitride-based semiconductor device, including a buffer layer formed on a substrate, a nitride-based semiconductor layer formed on the buffer layer, at least one ion implanted layer formed within the nitride-based semiconductor layer, and a channel layer formed on the nitride-based semiconductor layer.

According to another aspect of the example embodiments, there is provided a buffer layer on a substrate, a nitride-based semiconductor layer on the buffer layer, the nitride-based semiconductor layer including impurity ions at a predetermined distance from an upper surface thereof, and a channel layer on the upper surface of the nitride-based semiconductor layer.

The at least one ion implanted layer may include an impurity ion.

The impurity ion may be at least one of argon (Ar), carbon (C), hydrogen (H), nitrogen (N), boron (B), iron (Fe), magnesium (Mg), zinc (Zn), helium (He), neon (Ne), beryllium (Be), lithium (Li), silicon (Si), fluorine (F), sulfur (S), phosphorus (P), arsenic (As), strontium (Sr), tellurium (Te), and combinations thereof.

Each of the at least one ion implanted layer may include the same impurity ion or different impurity ions independently.

The at least one ion implanted layer may be formed at a depth in a range between 50 nanometers (nm) and 30 micrometers (μm) from a surface of the nitride-based semiconductor layer.

The at least one ion implanted layer may include two to ten layers.

The at least one ion implanted layer may be formed at an implantation energy in a range between 10 keV and 5 MeV.

The at least one ion implanted layer may be formed at a dose in a range of 1E17 ions/cm$^3$ to 5E21 ions/cm$^3$.

The nitride-based semiconductor layer may be at least one of gallium nitride (GaN), indium gallium nitride (InGaN), aluminum gallium nitride (AlGaN), aluminum indium gallium nitride (AlInGaN), aluminum nitride (AlN), indium nitride (InN), zinc indium nitride (ZnInN), zinc gallium nitride (ZnGaN), magnesium gallium nitride (MgGaN), and combinations thereof.

The nitride based semiconductor layer may be of a normally-ON type or a normally-OFF type.

According to still another aspect of the example embodiments, there is provided a method of manufacturing a nitride-based semiconductor device, the method including forming a buffer layer on a substrate, forming a nitride-based semiconductor layer on the buffer layer, forming at least one ion implanted layer by implanting an impurity ion into the nitride-based semiconductor layer, and forming a channel layer on the nitride-based semiconductor layer.

The impurity ion may be implanted into the nitride-based semiconductor layer using an ion implantation technique or a plasma immersion ion implantation technique.

The impurity ion may be at least one of Ar, C, H, N, B, Fe, Mg, Zn, He, Ne, Be, Li, Si, F, S, P, As, Sr, Te, and combinations thereof.

Each of the at least one ion implanted layer may include the same impurity ion or different impurity ions independently.

The at least one ion implanted layer may include two to ten layers.

The at least one ion implanted layer may be formed at different amounts of the impurity ion being implanted into the nitride-based semiconductor layer or at different depths in the nitride-based semiconductor layer by adjusting a dose of the impurity ion or an implantation energy.

The at least one ion implanted layer may be formed at a depth in a range between 50 nm and 30 μm from a surface of the nitride-based semiconductor layer by implanting the impurity ion at an implantation energy in a range between 10 keV and 5 MeV.

The at least one ion implanted layer may be formed by adjusting a dose of the impurity ion in a range of 1E17 ions/cm$^3$ to 5E21 ions/cm$^3$.

The method may further include annealing after implanting the impurity ion into the nitride-based semiconductor layer.

The nitride-based semiconductor layer may be at least one of GaN, InGaN, AlGaN, AlInGaN, AlN, InN, ZnInN, ZnGaN, MgGaN, and combinations thereof.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

When it is determined that a detailed description is related to a related known function or configuration which may make the purpose of the inventive concept unnecessarily ambiguous, such detailed description will be omitted. Also, terminology used herein is defined to appropriately describe the exemplary embodiments and thus may be changed depending on a user, the intent of an operator, or a custom. Accordingly, the terminology must be defined based on the following overall description of this specification.

Hereinafter, a nitride-based semiconductor device and a manufacturing method thereof according to the example embodiments are described in detail by referring to the accompanying drawings. However, the example embodiments are not limited to the described hereinafter.

Figure 1:
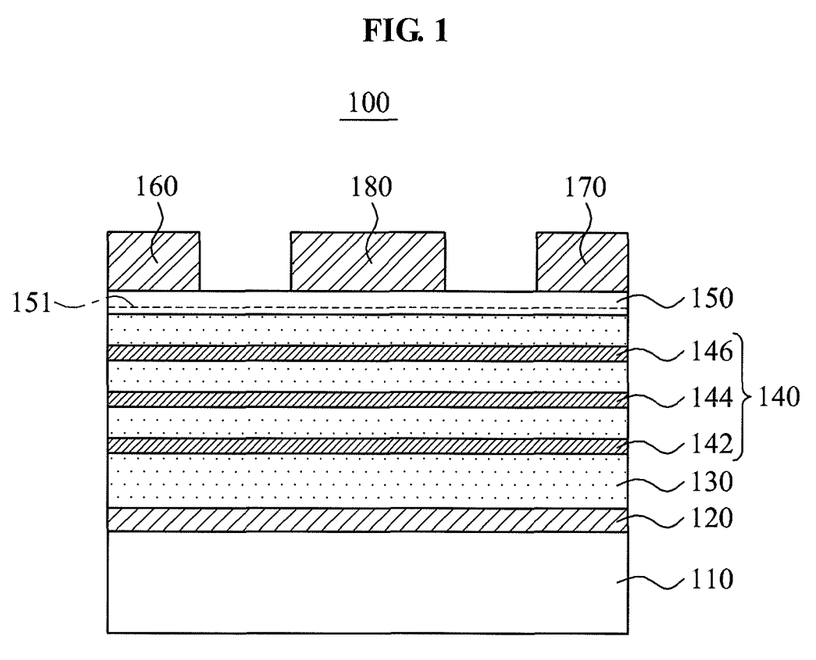
FIG. 1 illustrates a cross-sectional view of a structure of a nitride-based semiconductor device according to an embodiment.

FIG. 1 is a cross-sectional view illustrating a structure of a nitride-based semiconductor device 100 according to an embodiment.

Referring to FIG. 1, the nitride-based semiconductor device 100 may include a substrate 110, a buffer layer 120, a nitride-based semiconductor layer 130, at least one ion implanted layer 140, a channel layer 150, a source electrode 160, a drain electrode 170, and a gate electrode 180.

The substrate 110 may be any suitable substrate, on which a semiconductor layer is allowed to grow. For example, the substrate 110 may be made of sapphire, magnesium aluminate ($MgAl_2O_4$) spinel, gallium nitride (GaN), gallium arsenide (GaAs), silicon carbide (SiC), silicon (Si), zinc oxide (ZnO), zirconium diboride ($ZrB_2$), gallium phosphide (GaP), diamond, and combinations thereof. However, example embodiments are not limited in this regard. Further, the substrate 110 may have any suitable size or thickness, and may have any suitable plane orientation. The substrate 110 may include an off-substrate and a substrate without an off-angle, called a just substrate.

The buffer layer 120 may be used to relax, e.g., reduce, a lattice mismatch between the substrate 110 and the nitride-based semiconductor layer 130. For example, the buffer layer 120 may include, but is not limited to, an aluminum nitride (AlN) layer, a low temperature-SiC layer, and a low temperature-GaN layer.

The nitride-based semiconductor layer 130 may be formed on, e.g., directly on, the buffer layer 120. The nitride-based semiconductor layer 130 may be formed of a nitride-based material, e.g., gallium nitride (GaN), indium gallium nitride (InGaN), aluminum gallium nitride (AlGaN), aluminum indium gallium nitride (AlInGaN), aluminum nitride (AlN), indium nitride (InN), zinc indium nitride (ZnInN), zinc gallium nitride (ZnGaN), magnesium gallium nitride (MgGaN), and combinations thereof, however, example embodiments are not limited to said materials.

The at least one ion implanted layer 140 may be formed within the nitride-based semiconductor layer 130, e.g., the at least one ion implanted layer 140 may be spaced apart vertically from each of the uppermost and lowermost surfaces of the nitride-based semiconductor layer 130. For example, the at least one ion implanted layer 140 may include a plurality of sub-layers, e.g., two to ten sub-layers, spaced apart vertically from each other and from each of the uppermost and lowermost surfaces of the nitride-based semiconductor layer 130, e.g., the sub-layers may alternate with portions of the nitride-based semiconductor layer 130. For example, referring to FIG. 1, the at least one ion implanted layer 140 may be a triple layered ion implanted layer including a first ion implanted layer 142, a second ion implanted layer 144, and a third ion implanted layer 146 implanted at three different respective depths within the nitride-based semiconductor layer 130. For example, as ion implanted layer 140 is spaced apart from each of the uppermost and lowermost surfaces of the nitride-based semiconductor layer 130, the uppermost and lowermost surfaces of the nitride-based semiconductor layer 130 may be in direct contact with the channel layer 150 and the buffer layer 120, respectively.

The ion implanted layer 140 may include an impurity ion, and the impurity ion may be at least one of argon (Ar), carbon (C), hydrogen (H), nitrogen (N), boron (B), iron (Fe), magnesium (Mg), zinc (Zn), helium (He), neon (Ne), beryllium (Be), lithium (Li), silicon (Si), fluorine (F), sulfur (S), phosphorus (P), arsenic (As), strontium (Sr), tellurium (Te), and combinations thereof. However, example embodiments are not limited in this regard.

When the at least one ion implanted layer 140 includes a plurality of sub-layers, each of the plurality of sub-layers may include the same impurity ion or different impurity ions independently, however, example embodiments are not limited to such an arrangement. For example, referring to FIG. 1, the first ion implanted layer 142, the second ion implanted layer 144, and the third ion implanted layer 146 may all include an Ar ion. In another example, the first ion implanted layer 142 may include an Ar ion, the second ion implanted layer 144 may include a C ion, and the third ion implanted layer 146 may include a Fe ion.

The ion implanted layer 140 may be formed by implanting impurity ions in different amounts or at different depths within the nitride-based semiconductor layer 130. The impurity ion implantation may be formed by adjusting a dose of the impurity ion and/or the implantation energy. For example, an uppermost surface of the ion implanted layer 140 may be formed at a depth of about 50 nm to about 30 μm from an uppermost surface of the nitride-based semiconductor layer 130 by adjusting a dose to be about 1E17 ions/cm$^3$ to about 5E21 ions/cm$^3$ and an implantation energy to be about 10 keV to about 5 MeV. However, example embodiments are not limited thereto. It is noted that the uppermost surface of the nitride-based semiconductor layer 130 refers to an interface between the nitride-based semiconductor layer 130 and the channel layer 150, and an uppermost surface of the ion implanted layer 140 refers to an interface between the ion implanted layer 140 and the nitride-based semiconductor layer 130 that is closest to the upper surface of the nitride-based semiconductor layer 130.

The channel layer 150 may be formed on the nitride-based semiconductor layer 130. The channel layer 150 may be formed of, e.g., aluminum gallium nitride (AlGaN), indium gallium nitride (InGaN), aluminum boron nitrogen (AlBN), indium aluminum nitride (InAlN), indium aluminum gallium nitride (InAlGaN), and combinations thereof, however, example embodiments are not limited to said materials.

The source electrode 160 and the drain electrode 170 may be formed on the channel layer 150 at both ends, and the gate electrode 180 may be formed between the source electrode 160 and the drain electrode 170. Each of the source electrode 160, the drain electrode 170, and the gate electrode 180 may be independently made of, e.g., chromium (Cr), aluminum (Al), tantalum (Ta), titanium (Ti), gold (Au), silver (Ag), platinum (Pt), palladium (Pd), rhenium (Rh), iridium (Ir), ruthenium (Ru), osmium (Os), and combinations thereof, however example embodiments are not limited in this regard.

FIGS. 2A through 2E are cross-sectional views of stages in a method of manufacturing the nitride-based semiconductor device 100.

Figure 2A:
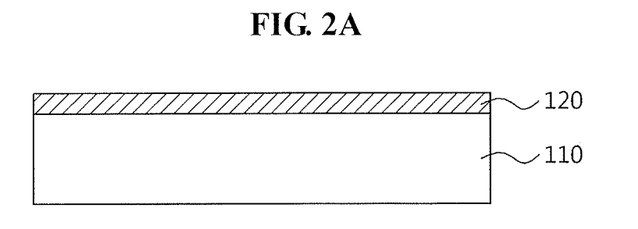
FIGS. 2A through 2E illustrate cross-sectional views of stages in a method of manufacturing a nitride-based semiconductor device according to an embodiment.

Referring to FIG. 2A, the buffer layer 120 may be formed on the substrate 110. The substrate 110 may include any type of substrate on which a semiconductor layer is allowed to grow. For example, the substrate 110 may be made of, e.g., sapphire, MgAl$_2$O$_4$ spinel, GaN, GaAs, SiC, Si, ZnO, ZrB$_2$, GaP, diamond, and combinations thereof, however, example embodiments are not limited to said materials. A size or thickness of the substrate 110 is not limited to a specific value. A plane orientation of the substrate 110 is not specially limited, and the substrate 110 may include an off-substrate and a substrate without an off-angle, called a just substrate.

The buffer layer 120 may be used to relax a lattice mismatch between the substrate 110 and the nitride-based semiconductor layer 130. The buffer layer 120 may include, but is not limited to, an AlN layer, a low temperature-SiC layer, and a low temperature-GaN layer. A lattice constant of the buffer layer 120 may be disposed at an intermediate position between a lattice constant of the substrate 110 and a lattice constant of the nitride-based semiconductor layer 130 to reduce a difference in lattice constant between the substrate 110 and the nitride-based semiconductor layer 130. The buffer layer 120 may be used to relieve stress caused by a lattice mismatch between the substrate 110 and the nitride-based semiconductor layer 130. Although an AlN layer, a low temperature-SiC layer, and a low temperature-GaN layer are provided as examples of the buffer layer 120, the buffer layer 120 may be made of any material having a lattice constant adequate for relieving stress caused by a lattice mismatch between the substrate 110 and the nitride-based semiconductor layer 130. The buffer layer 120, on which the nitride-based semiconductor layer 130 is allowed to grow, may have a thickness of about 200 Å to about 400 Å.

Figure 2B:
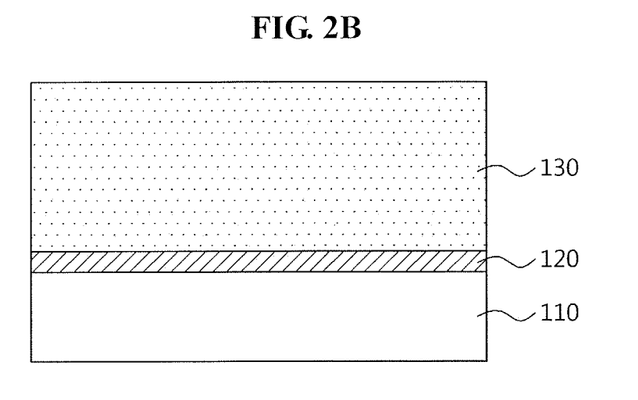

Referring to FIG. 2B, the nitride-based semiconductor layer 130 may be formed on the buffer layer 120. The nitride-based semiconductor layer 130 may be made of, e.g., GaN, InGaN, AlGaN, AlInGaN, MN, InN, ZnInN, ZnGaN, MgGaN, and combinations thereof, however, example embodiments are not limited said materials.

The nitride-based semiconductor layer 130 may be formed using a physical deposition technique or a chemical deposition technique. For example, the nitride-based semiconductor layer 130 may be grown by metal organic chemical vapor deposition (MOCVD), molecular beam epitaxy (MBE), hydride vapor phase epitaxy (HVPE), or atomic layer deposition (ALD), however, example embodiments are not limited to such techniques.

Figure 2C:
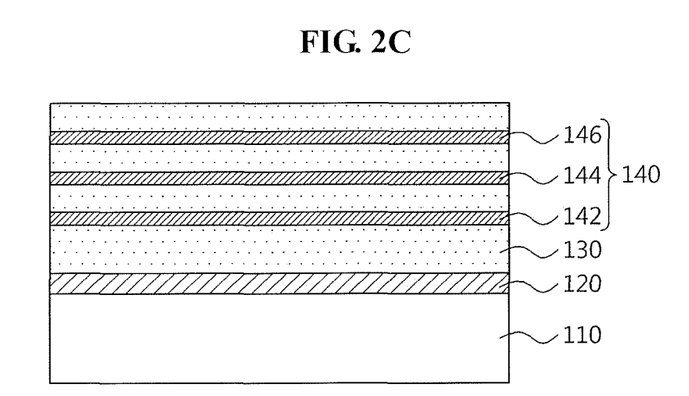

Referring to FIG. 2C, the at least one ion implanted layer 140 may be formed by implanting an impurity ion into the nitride-based semiconductor layer 130. Although FIG. 2C illustrates the at least one ion implanted layer 140 as a triple layered ion implanted layer including the first ion implanted layer 142, the second ion implanted layer 144, and the third ion implanted layer 146, example embodiments are not limited to such a structure. For example, the at least one ion implanted layer 140 may include two to ten layers.

The ion implanted layer 140 may include an impurity ion, and the impurity ion may be, e.g., Ar, C, H, N, B, Fe, Mg, Zn, He, Ne, Be, Li, Si, F, S, P, As, Sr, Te, and/or combinations thereof, however, example embodiments are not limited in this regard.

The impurity ion may be implanted into the nitride-based semiconductor layer 130 using, e.g., an ion implantation technique or a plasma immersion ion implantation technique, however, example embodiments are not limited to such techniques. The ion implantation technique may be used to manufacture an impurity semiconductor by ionizing a desired impurity, accelerating the ion with energy in a range of tens of keV to hundreds of keV, and implanting the impurity ion into a nitride-based semiconductor layer. The ion implantation technique may be carried out in vacuum or at room temperature.

Each of the at least one ion implanted layer 140 may include the same impurity ion or different impurity ions independently, however, example embodiments are not limited to such an arrangement. For example, the first ion implanted layer 142, the second ion implanted layer 144, and the third ion implanted layer 146 may all include an Ar ion. In another example, the first ion implanted layer 142 may include an Ar ion, the second ion implanted layer 144 may include a C ion, and the third ion implanted layer 146 may include an Fe ion.

The ion implanted layer 140 may be formed by implanting different amounts and/or at different depths impurity ions in the nitride-based semiconductor layer 130 by adjusting a dose of the impurity ion or the implantation energy. The ion implanted layer 140 may be formed after or before the channel layer 150 is formed on the nitride-based semiconductor layer 130. The ion implanted layer 140 may be formed at a depth of about 50 nm to about 30 μm from a surface of the nitride-based semiconductor layer 130 by adjusting a dose to be about 1E17 ions/cm$^3$ to about 5E21 ions/cm$^3$ and an implantation energy to be about 10 keV to about 5 MeV, however, example embodiments are not limited thereto.

After the at least one ion implanted layer 140 is formed within the nitride-based semiconductor layer 130, annealing may be performed. The annealing may ensure a high resistance value of the nitride-based semiconductor device 100 to improve reliability of a product.

Figure 2D:
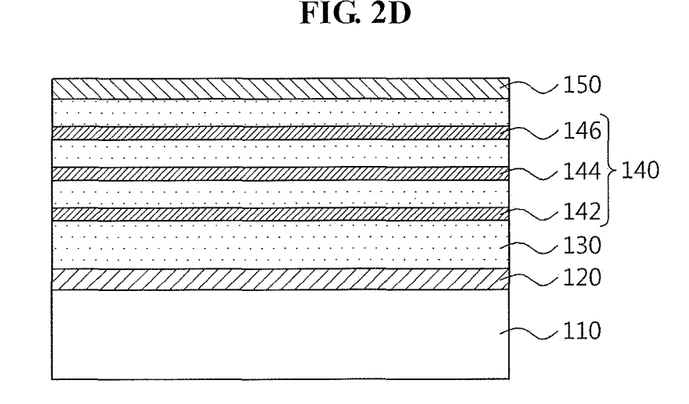

Referring to FIG. 2D, the channel layer 150 may be formed on the nitride-based semiconductor layer 130. The channel layer 150 may be made of, e.g., AlGaN, InGaN, AlBN, InAlN, InAlGaN, and combinations thereof, however, example embodiments are not limited to said materials. The channel layer 150 may be formed using a physical deposition technique or a chemical deposition technique. For example, the channel layer 150 may be grown by MOCVD, MBE, HVPE, or ALD, however, example embodiments are not limited to such techniques.

Figure 2E:
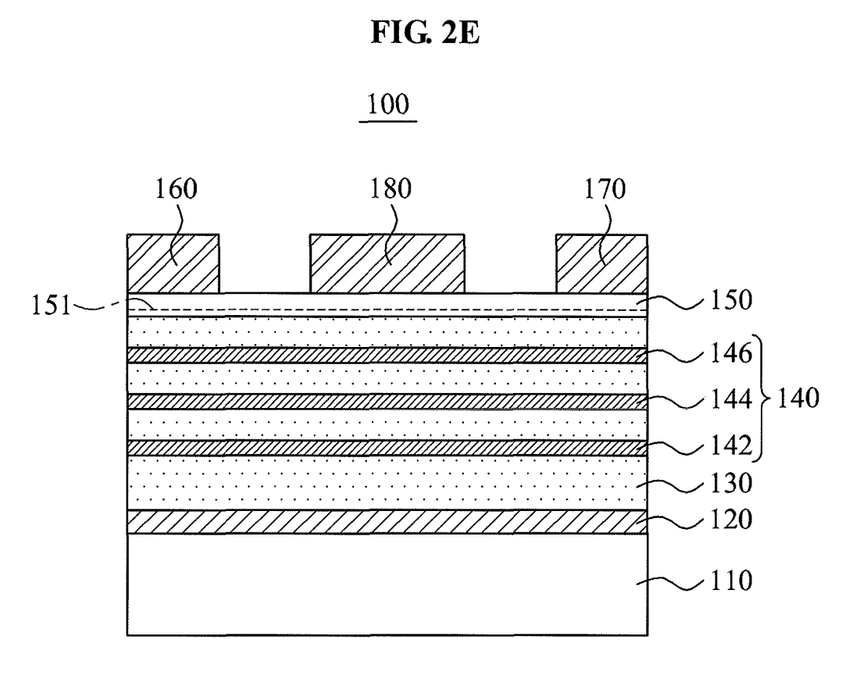

Referring to FIG. 2E, the source electrode 160 and the drain electrode 170 may be formed on the channel layer 150 at both ends, and the gate electrode 180 may be formed between the source electrode 160 and the drain electrode 170, to manufacture the nitride-based semiconductor device 100. Each of the source electrode 160, the drain electrode 170, and the gate electrode 180 may be independently made of, e.g., Cr, Al, Ta, Ti, Au, Ag, Pt, Pd, Rh, Ir, Ru, Os, and combinations thereof, however example embodiments are not limited to said materials.

In the nitride-based semiconductor device 100 according to example embodiments, a two-dimensional electron gas (2DEG) layer 151 may be formed due to a heterojunction structure between the nitride-based semiconductor layer 130 and the channel layer 150, i.e., different band gap energies of the nitride-based semiconductor layer 130 and the channel layer 150, thereby resulting in an interface polarization between. Therefore, example embodiments may improve resistance of the ion implanted layer 140, while ensuring crystallinity, by implanting impurity ions into the nitride-based semiconductor layer 130. Accordingly, example embodiments may provide a high-quality nitride-based semiconductor device with improved characteristics by avoiding impurities being introduced during growth, preventing dislocation, and reducing a leakage current.

Figure 3:
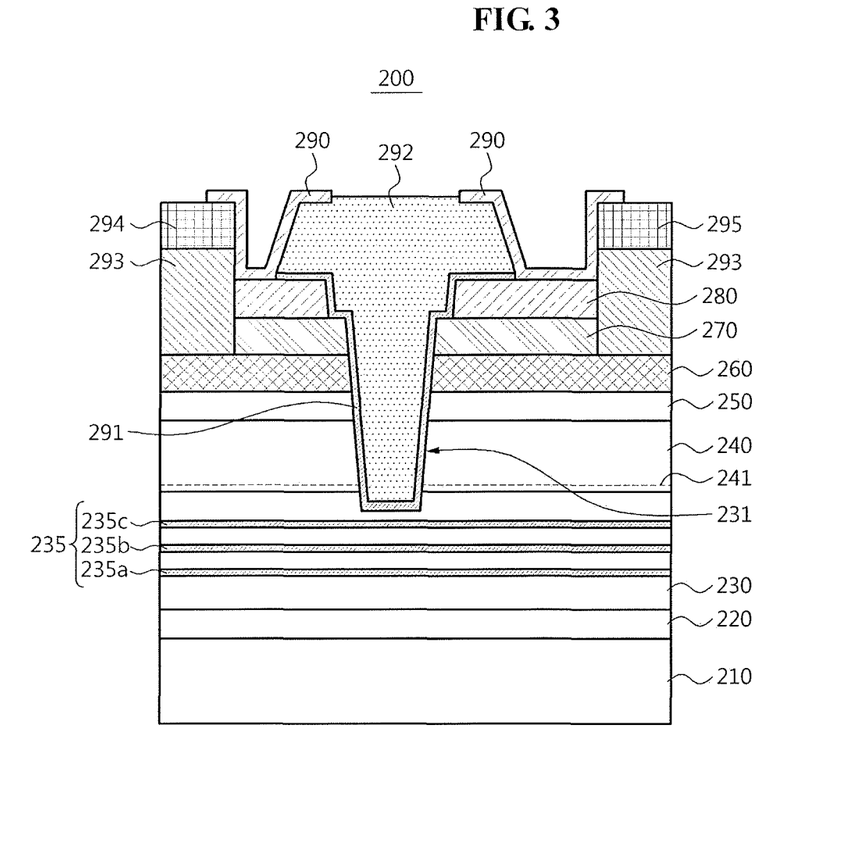
FIG. 3 illustrates a cross-sectional view of a structure of a nitride-based semiconductor device according to another embodiment.

FIG. 3 is a cross-sectional view illustrating a structure of a nitride-based semiconductor device 200 according to another embodiment. The nitride-based semiconductor device 200 may be of a normally-ON type or a normally-OFF type. In FIG. 3, the nitride-based semiconductor device 200 may correspond to a normally-OFF type of heterojunction field effect transistor (HFET).

Referring to FIG. 3, the nitride-based semiconductor device 200 may include a substrate 210, a buffer layer 220 formed on the substrate 210, a nitride-based semiconductor layer 230 formed on the buffer layer 220, at least one ion implanted layer 235 formed within the nitride-based semiconductor layer 230, a channel layer 240 formed on the nitride-based semiconductor layer 230, an undoped GaN layer 250 formed on the channel layer 240, a silicon carbon nitride ($Si_xC_{1-x}N$) functional layer 260 formed on the undoped GaN layer 250, and a first silicon nitride ($SiN_X$) layer 270 formed on the $Si_xC_{1-x}N$ functional layer 260.

The substrate 210 may include any type of substrate allowing a semiconductor layer to grow thereon. For example, the substrate 210 may be made of sapphire, $MgAl_2O_4$ spinel, GaN, GaAs, SiC, Si, ZnO, $ZrB_2$, GaP, diamond, and combinations thereof, however example embodiments are not limited to said materials. A size or thickness of the substrate 210 is not limited to a specific value. A plane orientation of the substrate 210 is not specially limited, and the substrate 210 may include an off-substrate and a substrate without an off-angle, called a just substrate. The buffer layer 220 may include, but is not limited to, e.g., an AlN layer, a low temperature-SiC layer, and a low temperature-GaN layer.

The nitride-based semiconductor layer 230 may be made e.g., GaN, InGaN, AlGaN, AlInGaN, AlN, InN, ZnInN, ZnGaN, MgGaN, and combinations thereof. However, example embodiments are not limited to said materials.

The at least one ion implanted layer 235 may be formed within the nitride-based semiconductor layer 230. Although the at least one ion implanted layer 235 is shown as a triple layered ion implanted layer including a first ion implanted layer 235a, a second ion implanted layer 235b, and a third ion implanted layer 235c, example embodiments are not limited to such a structure. For example, the at least one ion implanted layer 235 may include two to ten layers.

The ion implanted layer 235 may include an impurity ion, and the impurity ion may be, e.g., Ar, C, H, N, B, Fe, Mg, Zn, He, Ne, Be, Li, Si, F, S, P, As, Sr, Te, and/or combinations thereof, however example embodiments are not limited to said materials. Each of the at least one ion implanted layer 235 may include the same impurity ion or different impurity ions independently, however, example embodiments are not limited to such an arrangement. For example, the first ion implanted layer 235a, the second ion implanted layer 235b, and the third ion implanted layer 235c may all include an Ar ion. In another example, the first ion implanted layer 235a may include an Ar ion, the second ion implanted layer 235b may include a C ion, and the third ion implanted layer 235c may include an Fe ion.

The ion implanted layer 235 may be formed at different amounts of the impurity ion being implanted into the nitride-based semiconductor layer 230 or at different depths in the nitride-based semiconductor layer 230 by adjusting a dose of the impurity ion or the implantation energy. For example, the ion implanted layer 235 may be formed at a depth of about 50 nm to about about 30 μm from a surface of the nitride-based semiconductor layer 230 by adjusting a dose to be about $1E17$ ions/$cm^3$ to about $5E21$ ions/$cm^3$ and an implantation energy to be about 10 keV to about 5 MeV, however, example embodiments are not limited thereto.

The nitride-based semiconductor layer 230 may be exposed through a trench 231. That is, the trench 231 may be formed by etching a portion of the nitride-based semiconductor layer 230, the channel layer 240, the undoped GaN layer 250, the $Si_xC_{1-x}N$ functional layer 260, and the first $SiN_X$ layer 270.

The channel layer 240 may be made of e.g., AlGaN, InGaN, AlBN, InAlN, InAlGaN, and combinations thereof. However, example embodiments are not limited to said materials.

An insulating layer 291 may be formed along an inner wall of the trench 231. When a second $SiN_X$ layer 280 is formed on the first $SiN_X$ layer 270, as shown in FIG. 3, the insulating layer 291 may extend to a top of the second $SiN_X$ layer 280 along the inner wall of the trench 231. The insulating layer 291 may become a gate insulating layer, and a gate electrode 292 may be formed on the insulating layer 291.

The channel layer 240 may include a 2DEG layer 241. The 2DEG layer 241 may be formed due to a difference in band gap energy between the channel layer 240 and the GaN layer 250, and may act as a channel layer allowing an electric current to flow. The 2DEG layer 241 formed in the channel layer 240 may be divided by the trench 231. Since the 2DEG layer 241 is absent in the gate area, the nitride-based semiconductor device 200 may exhibit a normally-OFF type operation.

The $Si_xC_{1-x}N$ functional layer 260 may be exposed by etching portions of the first $SiN_X$ layer 270 and the second $SiN_X$ layer 280 to form a source electrode 294 and a drain electrode 295 at both ends.

The source electrode 294 may be formed on one portion of the $Si_xC_{1-x}N$ functional layer 260. In the exemplary embodiment, an ohmic metallic layer 293 may be formed on the $Si_xC_{1-x}N$ functional layer 260, and the source electrode 294 may be formed on the ohmic metallic layer 293.

The drain electrode 295 may be formed on the other portion of the $Si_xC_{1-x}N$ functional layer 260. In the exemplary embodiment, the ohmic metallic layer 293 may be formed on the $Si_xC_{1-x}N$ functional layer 260, and the drain electrode 295 may be formed on the ohmic metallic layer 293.

Each of the gate electrode 292, the source electrode 294, the drain electrode 295 may be made of, e.g., Nickel (Ni), aluminum (Al), titanium (Ti), titanium nitride (TiN), platinum (Pt), gold (Au), ruthenium oxide ($RuO_2$), vanadium (V), tungsten (W), tungsten nitride (WN), hafnium (HO, hafnium nitride (HfN), molybdenum (Mo), nickel silicide (NiSi), cobalt silicide ($CoSi_2$), tungsten silicide (WSi), platinum silicide (PtSi), iridium (Ir), zirconium (Zr), tantalum (Ta), tantalum nitride (TaN), copper (Cu), ruthenium (Ru), cobalt (Co), and/or combinations thereof. However, example embodiments are not limited to said materials.

A passivation layer 290 may be formed on an exposed portion of the second $SiN_X$ layer 280 between the gate electrode 292 and the source electrode 294, an exposed portion of the second $SiN_X$ layer 280 between the gate electrode 292 and the drain electrode 295.

Although a normally-OFF type HFET is taken as an example of the nitride-based semiconductor device, example embodiments are not limited in this regard. Example embodiments may be applied to various semiconductor devices, e.g., a Schottky diode and the like. In a case of a Schottky diode, a Schottky junction layer may be made of, e.g., Ni/Au, copper indium oxide ($CuInO_2$)/Au, indium tin oxide (ITO)/Au, Ni/Pt/Au, Pt/Au, and combinations thereof, and a passivation layer may be made of, e.g., $SiN_X$, silicon oxide ($SiO_X$), aluminum oxide ($Al_2O_3$), SiC, and combinations thereof. However, example embodiments are not limited to said materials.

According to the exemplary embodiments, resistance of an ion implanted layer within a nitride-based semiconductor layer may be improved, while ensuring crystallinity, by implanting an impurity ion into the nitride-based semiconductor layer at adjusted impurity ion energy. Accordingly, the example embodiments may include a high-quality nitride-based semiconductor device with improved characteristics by avoiding impurities being introduced during growth, preventing dislocation, and reducing a leakage current.

In contrast, a conventional GaN-based semiconductor layer is grown on a sapphire substrate. However, differences in a lattice constant and a thermal expansion coefficient between the GaN-based semiconductor layer and the sapphire substrate make it difficult to grow a defect-free monocrystalline layer. For example, during growth of the GaN-based semiconductor layer on the sapphire substrate, impurities, e.g., oxygen, may be introduced, or nitrogen vacancies may be formed due to high volatility of nitrogen, leading to n-type conduction characteristics, which makes it difficult to grow a semi-insulating layer. Also, when manufacturing a HFET or a Schottky barrier diode (SBD) device using a high-resistance GaN buffer layer doped with iron (Fe) or carbon (C) ions, leakage current may occur, thereby causing low transconductance and an insertion loss.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nitride-based semiconductor device, comprising:
    a buffer layer disposed on a substrate;
    a nitride-based semiconductor layer disposed on the buffer layer;
    the nitride-based semiconductor layer including a plurality of ion implanted layers, each including at least one impurity ion, each of the plurality of ion implanted layers being vertically spaced apart from one another in the nitride-based semiconductor layer;
    a channel layer disposed on the nitride-based semiconductor layer;
    a gate electrode, a source electrode, and a drain electrode respectively disposed on the channel layer;
    an undoped layer over the channel layer; and
    a functional layer over the undoped layer, wherein:
    each of the plurality of ion implanted layers overlaps the gate electrode, the source electrode, and the drain electrode,
    the nitride-based semiconductor layer includes at least one interlayer portion interposed between the plurality of ion implanted layers, the at least one interlayer portion being formed of a same material as another portion of the nitride-based semiconductor layer,
    the gate extends through the undoped layer and the functional layer, and
    the gate extends through the channel layer to a level of the nitride-based semiconductor layer.

2. The semiconductor device as claimed in claim 1, wherein the impurity ion is at least one of argon (Ar), carbon (C), hydrogen (H), nitrogen (N), boron (B), iron (Fe), magnesium (Mg), zinc (Zn), helium (He), neon (Ne), beryllium (Be), lithium (Li), silicon (Si), fluorine (F), sulfur (S), phosphorus (P), arsenic (As), strontium (Sr), or tellurium (Te).

3. The semiconductor device as claimed in claim 1, wherein each of the plurality of ion implanted layers includes a same impurity ion.

4. The semiconductor device as claimed in claim 1, wherein each of the plurality of ion implanted layers is at a depth of about 50 nm to about 30 μm from an upper most surface of the nitride-based semiconductor layer.

5. The semiconductor device as claimed in claim 1, wherein the plurality of ion implanted layers includes two to ten sub-layers.

6. The semiconductor device as claimed in claim 1, wherein the nitride-based semiconductor layer and the channel layer define a heterojunction therebetween.

7. The semiconductor device as claimed in claim 1, wherein the nitride-based semiconductor layer includes at least one of gallium nitride (GaN), indium gallium nitride (InGaN), aluminum gallium nitride (AlGaN), aluminum indium gallium nitride (AlInGaN), aluminum nitride (AlN), indium nitride (InN), zinc indium nitride (ZnInN), zinc gallium nitride (ZnGaN), or magnesium gallium nitride (MgGaN).

8. The semiconductor device as claimed in claim 1, wherein each of the plurality of ion implanted layers respectively includes a different impurity ion.

9. The semiconductor device as claimed in claim 1, wherein the undoped layer includes GaN.

10. The semiconductor device as claimed in claim 1, wherein the functional layer includes silicon carbon nitride.

11. A method of manufacturing a nitride-based semiconductor device, the method comprising:
forming a buffer layer on a substrate;
forming a nitride-based semiconductor layer on the buffer layer;
forming a plurality of ion implanted layers in the nitride-based semiconductor layer, each of the plurality of ion implanted layers including at least one impurity ion and being vertically spaced apart from one another in the nitride-based semiconductor layer;
forming a channel layer on the nitride-based semiconductor layer;
forming an undoped layer over the channel layer; and
forming a functional layer over the undoped layer, wherein:
a gate electrode, a source electrode, and a drain electrode are respectively disposed on the channel layer,
each of the plurality of ion implanted layers overlaps the gate electrode, the source electrode, and the drain electrode,
the nitride-based semiconductor layer includes at least one interlayer portion interposed between the plurality of ion implanted layers, the at least one interlayer portion being formed of a same material as another portion of the nitride-based semiconductor layer,
the gate extends through the undoped layer and the functional layer, and
the gate extends through the channel layer to a level of the nitride-based semiconductor layer.

12. The method as claimed in claim 11, wherein implanting the impurity ion into the nitride-based semiconductor layer includes using an ion implantation technique or a plasma immersion ion implantation technique.

13. The method as claimed in claim 11, wherein implanting the impurity ion into the nitride-based semiconductor layer includes implanting at least one of argon (Ar), carbon (C), hydrogen (H), nitrogen (N), boron (B), iron (Fe), magnesium (Mg), zinc (Zn), helium (He), neon (Ne), beryllium (Be), lithium (Li), silicon (Si), fluorine (F), sulfur (S), phosphorus (P), arsenic (As), strontium (Sr), or tellurium (Te).

14. The method as claimed in claim 11, wherein forming the at least one ion implanted layer includes forming two to ten sub-layers.

15. The method as claimed in claim 11, wherein forming the at least one ion implanted layer includes adjusting a dose of the impurity ion or an implantation energy to implant different amounts of an impurity ion into the nitride-based semiconductor layer or to implant the impurity ion at different depths within the nitride-based semiconductor layer.

16. The method as claimed in claim 11, wherein forming the at least one ion implanted layer includes implanting ions at a depth of about 50 nm to about 30 µm from an uppermost surface of the nitride-based semiconductor layer by using implantation energy of about 10 keV to about 5 MeV.

17. The method as claimed in claim 11, wherein forming the at least one ion implanted layer includes adjusting a dose of the impurity ion from about 1E17 ions/cm$^3$ to about 5E21 ions/cm$^3$.

18. The method as claimed in claim 11, further comprising annealing after implanting the impurity ion into the nitride-based semiconductor layer.

19. The method as claimed in claim 11, wherein forming the nitride-based semiconductor layer includes using at least one of gallium nitride (GaN), indium gallium nitride (InGaN), aluminum gallium nitride (AlGaN), aluminum indium gallium nitride (AlInGaN), aluminum nitride (AlN), indium nitride (InN), zinc indium nitride (ZnInN), zinc gallium nitride (ZnGaN), or magnesium gallium nitride (MgGaN), and combinations thereof.

* * * * *